United States Patent

Jang et al.

[11] Patent Number: 6,080,635

[45] Date of Patent: Jun. 27, 2000

[54] METHOD OF PHOTO ALIGNMENT FOR SHALLOW TRENCH ISOLATION WITH CHEMICAL MECHANICAL POLISHING

[75] Inventors: Syun-Ming Jang, Hsin-Chu; Jui-Yu Chang, Tao-Yuan, both of Taiwan

[73] Assignee: Taiwan Semiconductor Manufacturing Company, Hsin-Chu, Taiwan

[21] Appl. No.: 09/067,262

[22] Filed: Apr. 27, 1998

[51] Int. Cl.⁷ .................................................. H01L 21/76
[52] U.S. Cl. .......................................... 438/401; 438/424
[58] Field of Search ................... 438/400, 401, 438/424

[56] References Cited

U.S. PATENT DOCUMENTS

| | | | |
|---|---|---|---|
| 5,266,511 | 11/1993 | Takao | 437/51 |
| 5,401,691 | 3/1995 | Caldwell | 437/228 |
| 5,627,110 | 5/1997 | Lee et al. | 438/692 |
| 5,893,744 | 4/1999 | Wang | 438/401 |
| 5,911,110 | 6/1999 | Yu | 438/424 |
| 5,923,996 | 7/1999 | Shih et al. | 438/462 |
| 5,930,644 | 7/1999 | Tsai et al. | 438/424 |
| 5,963,816 | 10/1999 | Wang et al. | 438/401 |

*Primary Examiner*—Caridad Everhart
*Attorney, Agent, or Firm*—George O. Saile; Stephen B. Ackerman; Larry J. Prescott

[57] ABSTRACT

A method of preserving alignment marks in integrated circuit substrates using shallow trench isolation after planarization using chemical mechanical polishing. A layer of silicon nitride is formed on the substrate and openings defining alignment trenches and isolation trenches are etched in the silicon nitride layer. Alignment trenches are formed in alignment regions of the substrate and isolation trenches are formed in the active region of the substrate during the same process step using the openings in the silicon nitride layer as a mask. A layer of dielectric is then deposited on the substrate filling the alignment trenches and the isolation trenches. The dielectric is then etched away from the alignment trenches and the substrate is planarized. After a layer of conducting material is deposited on the wafer the alignment trenches are preserved.

19 Claims, 5 Drawing Sheets

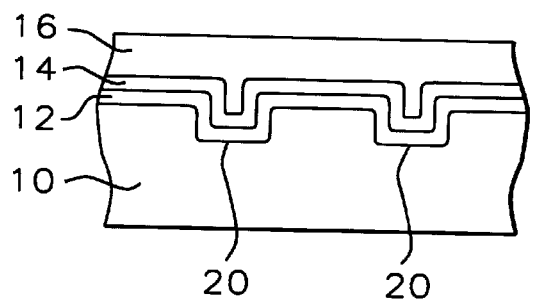
FIG. 1A – Prior Art
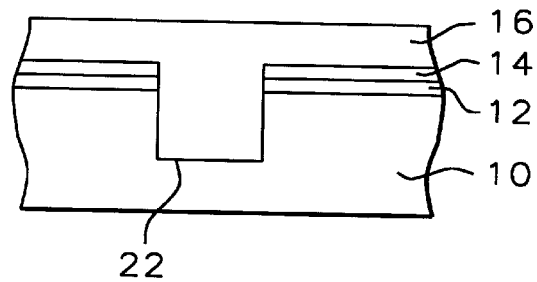
FIG. 1B – Prior Art
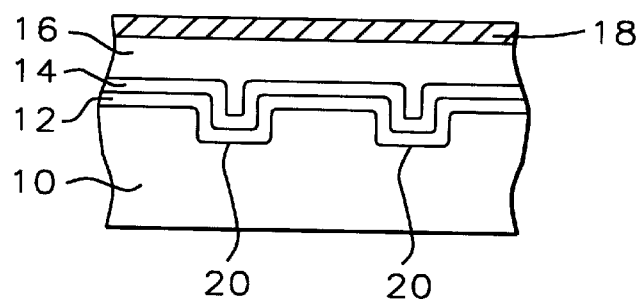
FIG. 2A – Prior Art
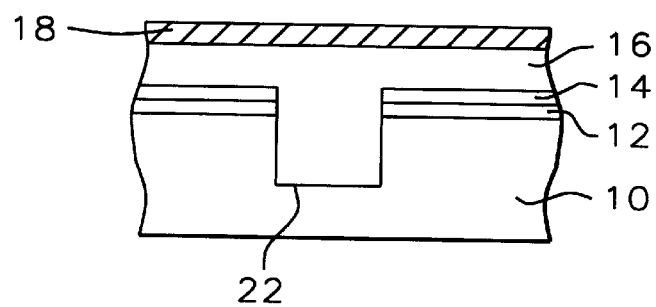
FIG. 2B – Prior Art

METHOD OF PHOTO ALIGNMENT FOR SHALLOW TRENCH ISOLATION WITH CHEMICAL MECHANICAL POLISHING

BACKGROUND OF THE INVENTION (1) Field of the Invention

This invention relates to methods of preserving alignment marks in integrated circuit substrates and more particularly to preserving alignment marks in methods using shallow trench isolation and chemical mechanical polishing.

(2) Description of the Related Art

U.S. Pat. No. 5,266,511 to Takao describes forming an alignment mark on the top surface of a first substrate which has been covered with a first insulating layer and planarized. The alignment mark is located in the scribe line area. A second substrate is provided with a groove corresponding to the scribe line area having the alignment mark. The two substrates are brought together in facing contiguous relationship and bonded together using an infrared microscope to align the groove to the alignment mark.

U.S. Pat. No. 5,401,691 to Caldwell describes a method of forming an alignment mark during semiconductor device manufacturing. The method uses a first area and a second area provided on a semiconductor substrate with the first area adjacent to the second area. The invention describes the formation of an alignment mark using an inverse open frame.

U.S. Pat. No. 5,627,110 to Lee et al. describes a method of exposing an alignment mark without the need to use additional mask process.

A patent application TSMC-97-354 Ser. No. 09/135,043 Filed Aug. 17, 1998, entitled "REGENERATION OF ALIGNMENT MARKS AFTER SHALLOW TRENCH ISOLATION WITH CHEMICAL MECHANICAL POLISHING" and assigned to the same assignee describes methods of preserving alignment marks in integrated circuit substrates.

SUMMARY OF THE INVENTION

Shallow trench isolation is often used to provide isolation between various parts of the active region of a semiconductor integrated circuit wafer. In shallow trench isolation shallow isolation trenches are formed in the wafer. A layer of dielectric, such as silicon dioxide, is then formed on the wafer filling the isolation trenches. The wafer is then planarized using a means such as chemical mechanical polishing followed by deposition of a layer of metal for the formation of electrodes. Unless care is taken the alignment marks used to align masks to the wafer can be lost after the layer of metal has been deposited. Preserving the alignment marks on a semiconductor wafer after chemical mechanical polishing is critical to maintaining mask alignment for those steps which follow the chemical mechanical polishing.

The problem encountered in maintaining the alignment marks is illustrated in FIGS. 1A–2B. FIG. 1A shows a cross section of alignment marks 20 in a wafer 10 and FIG. 1B shows a cross section of a part of the active region of the wafer 10 having an isolation trench 22. As shown in FIG. 1A, the alignment marks 20 are formed in the wafer 10 before wafer processing begins. A layer of pad oxide 12 is then formed on the wafer 10 followed by a layer of silicon nitride 14 formed on the layer of pad oxide 12. As shown in FIG. 1B openings 19 are formed in the layer of silicon nitride 14 using the alignment marks to locate the proper location of the openings 19. Using the openings 19 in the layer of silicon nitride 14 as a mask openings are formed in the layer of pad oxide 12 and isolation trenches 20 are formed in the wafer 10. A layer of dielectric 16, such as silicon dioxide, is then deposited on the wafer filling the isolation trenches 20, FIG. 1B, and also covering the alignment marks 20, FIG. 1A. The layer of dielectric 16 is then planarized using a means such as chemical mechanical polishing.

As shown in FIGS. 2A and 2B, a layer of metal 18 is then deposited on the wafer covering the alignment marks 20, FIG. 2A, as well as the active regions of the wafer, FIG. 2B. Since the layer of opaque metal 18 covers the alignment marks 20 and the layer of dielectric 16 has been planarized the alignment marks can no longer be used for alignment of masks used in subsequent process steps.

It is a principle objective of this invention to provide a method of preserving alignment marks during and after the steps of forming isolation trenches, filling the trenches with dielectric, planarization of the wafer after filling the trenches with dielectric, and deposition of a layer of metal on the planarized wafer.

These objectives are achieved by forming a number of new alignment marks, in addition to the base alignment marks, in another region of the wafer, such as the scribe line, at the same time the isolation trenches are formed. A layer of dielectric is then deposited on the wafer filling the new alignment marks as well as the isolation trenches. A layer of resist material is then deposited on the wafer and patterned forming a resist mask covering the isolation trenches but not covering the new alignment marks. That part of the dielectric not covered by the resist mask is then etched away thereby removing dielectric from the new alignment marks but leaving dielectric in the isolation trenches.

The wafer is then planarized using a means such as chemical mechanical polishing and a layer of metal is deposited on the wafer. The new alignment marks are preserved in the layer of metal and can be used for subsequent process steps. The new alignment marks can be placed on the scribe line and do not decrease the amount of active area available on the wafer. The resist layer can be patterned at the same time patterning of the active region of the wafer is accomplished and does not add process steps.

BRIEF DESCRIPTION OF THE DRAWINGS

FIG. 1A shows a cross section view of a base alignment region of a wafer after deposition of a layer of dielectric and planarization using conventional methods.

FIG. 1B shows a cross section view of a part of the active region of a wafer having an isolation trench after deposition of a layer of dielectric and planarization using conventional methods.

FIG. 2A shows a cross section view of the base alignment region of the wafer shown in FIG. 1A after deposition of a layer of metal.

FIG. 2B shows a cross section view of the active region of the wafer shown in FIG. 1B after deposition of a layer of metal.

DESCRIPTION OF THE PREFERRED EMBODIMENTS

Figure 3A:
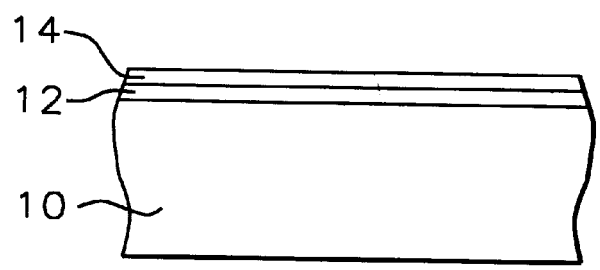
FIG. 3A shows a cross section view of the alignment region of this invention after forming a layer of pad oxide and a layer of silicon nitride.
Figure 3B:
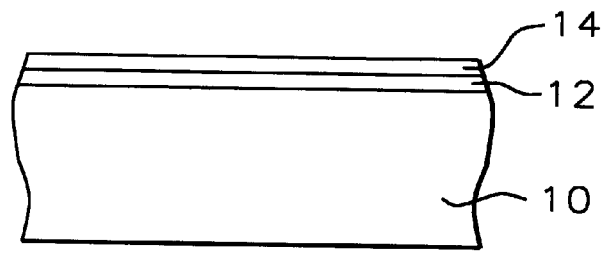
FIG. 3B shows a cross section view of the active region of a wafer where the isolation trench will be formed after forming a layer of pad oxide and a layer of silicon nitride.
Figure 3C:
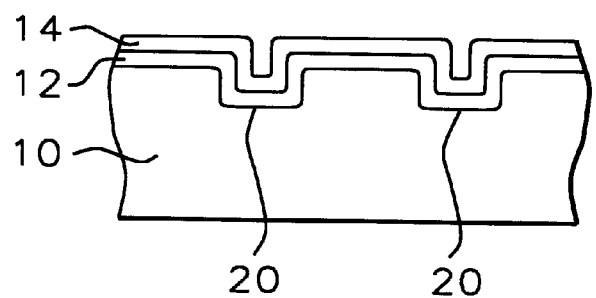
FIG. 3C shows a cross section of the base alignment region after forming a layer of pad oxide and a layer of silicon nitride.

Refer now to FIGS. 3A–7B for a description oil the preferred embodiment of this invention. FIGS. 3A and 3B show cross section views of a part of the active region of a silicon integrated circuit substrate, FIG. 3B, and a region on the substrate where new alignment trenches will be formed, FIG. 3A. FIG. 3C shows a cross section of the region on the substrate where the base alignment marks 20 are formed. The region on the substrate where new alignment trenches will be formed will be referred to as the alignment region of the substrate and is located on a region of the substrate which is separate from the active region of the substrate, such as on a scribe line of the substrate. As shown in FIGS. 3A–3B a layer of pad oxide 12, such as silicon dioxide, is formed on the substrate and a layer of silicon nitride 14 is formed on the layer of pad oxide 12.

Figure 4A:
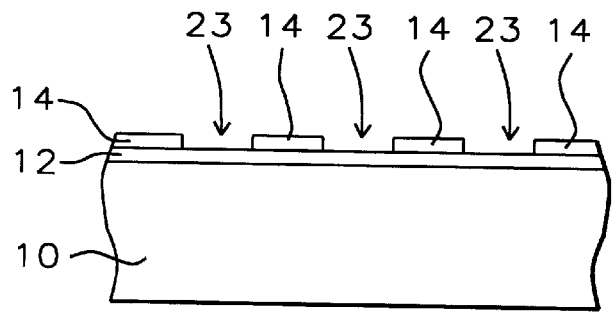
FIG. 4A shows a cross section of the alignment region showing openings formed in the silicon nitride layer for the new alignment marks of this invention.
Figure 4B:
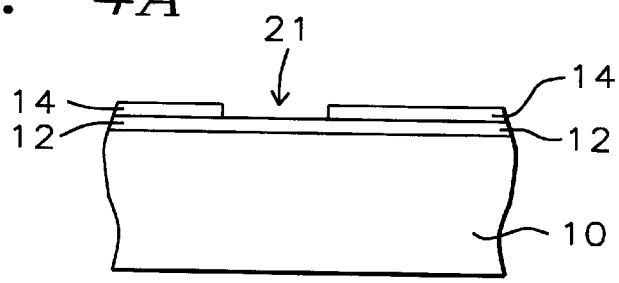
FIG. 4B shows a cross section view of the active region showing openings formed in the silicon nitride layer for the isolation trench.

FIG. 4A shows a cross section view of a part of the alignment region of the substrate. FIG. 4B shows a cross section view of a part of the active region of the substrate where an isolation trench will be formed. As shown in FIGS. 4A and 4B openings, 21 and 23, are formed in the silicon nitride layer 14 using standard photolithography techniques and etching. The openings 21 and 23 in the silicon nitride layer 14 are aligned to the substrate using the base alignment marks 20 shown in FIG. 3C. The opening 23 in the alignment region defines the perimeter of the alignment trenches and the opening 21 in the active region defines the perimeter of the isolation trench.

Figure 5A:
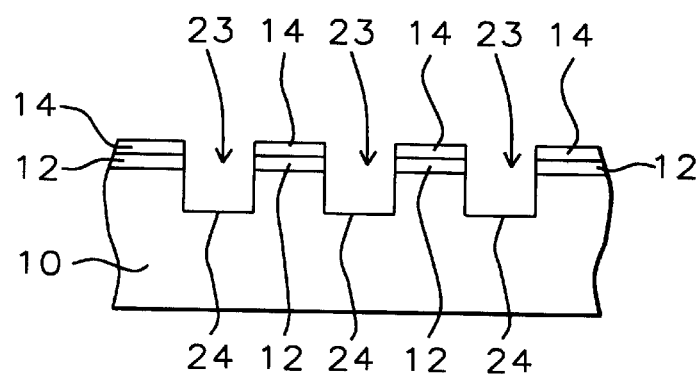
FIG. 5A shows a cross section of the new alignment marks formed in the alignment region of this invention.
Figure 5B:
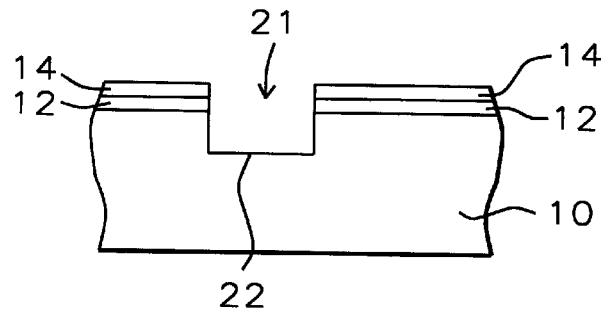
FIG. 5B shows a cross section view of the isolation trench.
Figure 6A:
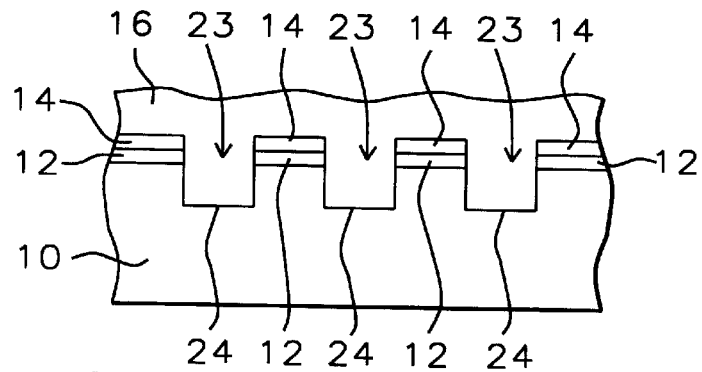
FIG. 6A shows a cross section view of the alignment region of this invention after a layer of dielectric has been deposited and a patterned layer of resist has been formed.
Figure 6B:
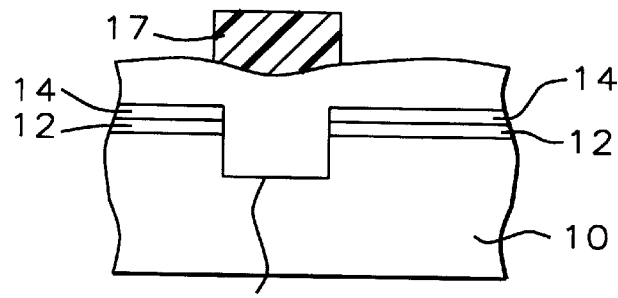
FIG. 6B shows a cross section view of the isolation trench after a layer of dielectric has been deposited and a patterned layer of resist has been formed.

As shown in FIG. 5A the silicon nitride layer 14 with openings 23 is used as a mask to etch through the pad oxide layer and form alignment trenches 24 in the substrate 10. As shown in FIG. 5B the silicon nitride layer with openings 21 is used as a mask to etch through the pad oxide layer and form isolation trenches 22 in the substrate 10. As shown in FIGS. 6A and 6B a layer of dielectric 16, such as silicon dioxide is formed on the substrate filling the alignment trenches 24, see FIG. 6A, and isolation trench 22, see FIG. 6B. A layer of resist is then formed over the layer of dielectric 16 and patterned forming a resist mask 17. As shown in FIGS. 6A and 6B the resist mask 17 covers the isolation trenches 22 but does not cover the alignment trenches 24.

Figure 7A:
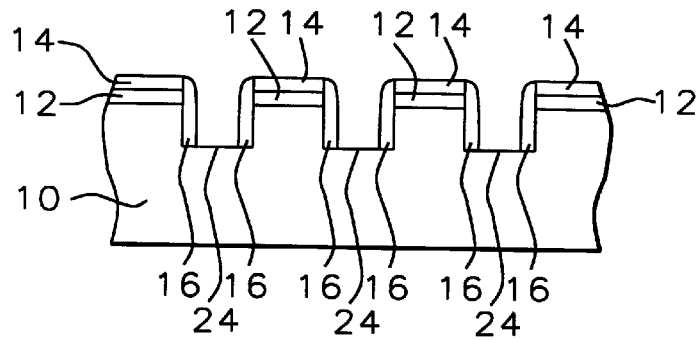
FIG. 7A shows a cross section view of the alignment region of this invention after that part of the layer of dielectric not covered by the patterned layer of resist has been removed.
Figure 7B:
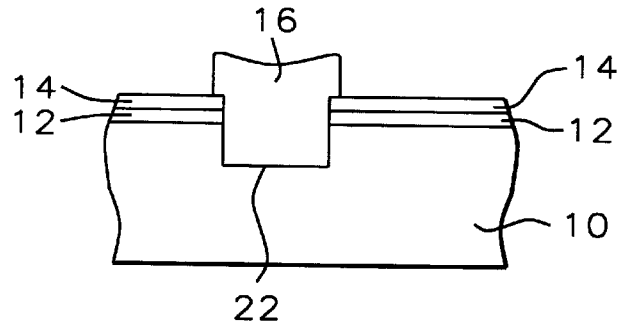
FIG. 7B shows a cross section view of the isolation trench after that part of the layer of dielectric not covered by the patterned layer of resist has been removed.

As shown in FIGS. 7A and 7B that part of the dielectric layer 16 which is not covered by the photoresist mask is etched away using vertical anisotropic etching thereby removing dielectric from the alignment trenches 24 except for dielectric spacers 16 remaining on the sidewalls of the trenches forming the alignment trenches 24, see FIG. 7A. Dielectric 16 remains in the isolation trench 22 to provide electrical isolation between different parts of the active region of the substrate, see FIG. 7B.

Figure 8A:
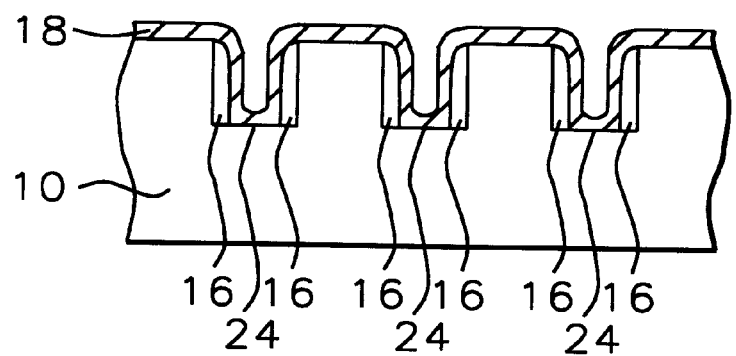
FIG. 8A shows a cross section view of the alignment region of this invention after the wafer has been planarized, thereby removing the layer of silicon nitride and the layer of pad oxide, and a layer of metal deposited.
Figure 8B:
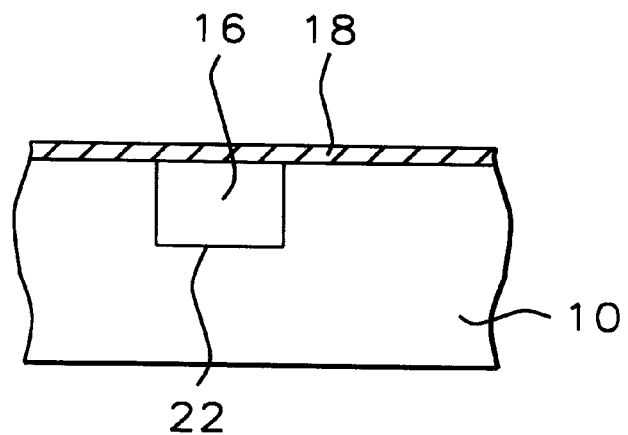
FIG. 8B shows a cross section view of the isolation trench after the wafer has been planarized, thereby removing the layer of silicon nitride and the layer of pad oxide, and a layer of metal deposited.

As shown in FIGS. 8A and 8B the substrate is then planarized using means such as chemical mechanical polishing, thereby removing the layer of pad oxide and the layer of silicon nitride. A layer of conducting material 18, such as polysilicon or aluminum, is then deposited on the substrate. As can be seen in FIG. 8A, the layer of conducting material 18 conforms to the profile of the alignment trenches 24 and the alignment trenches can be used for alignment of masks used in subsequent process steps to the substrate. The alignment trenches 24 are formed at the same time the isolation trenches 22 are formed. The formation of the resist mask 17 and the etching of the dielectric layer 16 can be combined with reverse-tone patterning of the active region of the substrate prior to chemical mechanical polishing so that this invention does not require any additional process steps.

While the invention has been particularly shown and described with reference to the preferred embodiments thereof, it will be understood by those skilled in the art that various changes in form and details may be made without departing from the spirit and scope of the invention.

What is claimed is:

1. A method of preserving alignment marks, comprising the steps of:

providing a substrate having active regions, alignment regions, and base alignment marks;

providing a layer of silicon nitride on said substrate;

patterning said layer of silicon nitride thereby forming openings in said layer of silicon nitride;

etching isolation trenches in said active region of said substrate using said patterned layer of silicon nitride as a mask;

etching alignment trenches in said alignment region of said substrate using said patterned layer of silicon nitride as a mask, wherein said etching said alignment trenches and said etching said isolation trenches are carried out during the same process step;

forming a layer of dielectric on said substrate thereby filling said isolation trenches and said alignment trenches;

etching away said dielectric from said alignment trenches using vertical anisotropic etching; and planarizing said substrate after etching away said dielectric from said alignment trenches.

2. The method of claim 1 wherein said alignment regions of said substrate are located in said substrate scribe lines.

3. The method of claim 1 wherein said dielectric is silicon dioxide.

4. The method of claim 1 wherein said planarizing said substrate uses chemical mechanical polishing.

5. The method of claim 1 wherein a layer of pad oxide is formed on said substrate before said layer of silicon nitride is formed on said substrate.

6. The method of claim 1 wherein during said step of etching away said dielectric from said alignment trenches a mask of resist material is used to prevent etching away said dielectric from said isolation trenches.

7. The method of claim 1 wherein said substrate is a silicon integrated circuit wafer.

8. The method of claim 1 wherein said isolation trenches provide electrical isolation between parts of said active regions of said substrate.

9. The method of claim 1 wherein said patterning said layer of silicon nitride uses said base alignment marks to align said openings in said layer of silicon nitride.

10. The method of claim 1 further comprising reverse-tone patterning of said active regions of said substrate before said planarizing said substrate.

11. The method of claim 10 wherein said etching away said dielectric from said alignment trenches is accomplished during said reverse-tone patterning of said active regions of said substrate.

12. A method of preserving alignment marks, comprising the steps of:

providing a substrate having active regions, alignment regions, and base alignment marks;

forming a layer of pad oxide on said substrate covering said active regions, said alignment regions, and said base alignment marks;

forming a layer of silicon nitride on said layer of pad oxide;

patterning said layer of silicon nitride thereby forming openings in said layer of silicon nitride using said base alignment marks to align said openings in said layer of silicon nitride;

patterning said layer of pad oxide using said openings in said layer of silicon nitride as a mask thereby forming openings in said layer of pad oxide;

etching isolation trenches in said active region of said substrate using said patterned layer of silicon nitride as a mask;

etching alignment trenches in said alignment region of said substrate using said patterned layer of silicon nitride as a mask, wherein said etching said alignment trenches and said etching said isolation trenches are carried out during the same process step;

forming a layer of dielectric on said substrate thereby filling said isolation trenches and said alignment trenches with said dielectric;

forming a layer of resist material on said layer of dielectric;

patterning said layer of resist material so that said resist material remains directly over said isolation trenches and is removed from directly over said alignment trenches;

etching away said dielectric from said alignment trenches using vertical anisotropic etching and said patterned layer of resist material as a mask thereby leaving said dielectric in said isolation trenches;

removing said patterned layer of resist material; and planarizing said substrate after etching away said dielectric from said alignment trenches, thereby removing said patterned layer of silicon nitride and said patterned layer of pad oxide.

13. The method of claim 12 wherein said alignment regions of said substrate are located in said substrate scribe lines.

14. The method of claim 12 wherein said dielectric is silicon dioxide.

15. The method of claim 12 wherein said planarizing said substrate uses chemical mechanical polishing.

16. The method of claim 12 wherein said substrate is a silicon integrated circuit wafer.

17. The method of claim 12 wherein said isolation trenches provide electrical isolation between parts of said active regions of said substrate.

18. The method of claim 12 further comprising reverse-tone patterning of said active regions of said substrate before said planarizing said substrate.

19. The method of claim 18 wherein said forming a layer of resist material on said layer of dielectric, said patterning said layer of resist material, and said etching away said dielectric from said alignment trenches using said patterned layer of resist material as a mask are accomplished during said reverse-tone patterning of said active regions of said substrate.

* * * * *